United States Patent
Yoo et al.

(10) Patent No.: US 10,826,442 B2
(45) Date of Patent: Nov. 3, 2020

(54) VARIABLE GAIN LOW NOISE AMPLIFIER WITH PHASE COMPENSATION

(71) Applicant: SAMSUNG ELECTRO-MECHANICS CO., LTD., Suwon-si (KR)

(72) Inventors: Hyun Jin Yoo, Suwon-si (KR); Jong Mo Lim, Suwon-si (KR); Yoo Hwan Kim, Suwon-si (KR); Hyung Jun Cho, Suwon-si (KR); Hyun Hwan Yoo, Suwon-si (KR); Yoo Sam Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 60 days.

(21) Appl. No.: 16/196,173

(22) Filed: Nov. 20, 2018

(65) Prior Publication Data
US 2019/0341891 A1    Nov. 7, 2019

(30) Foreign Application Priority Data

May 3, 2018  (KR) .................. 10-2018-0051200

(51) Int. Cl.
*H03F 1/34* (2006.01)
*H03F 3/16* (2006.01)
*H03G 3/30* (2006.01)

(52) U.S. Cl.
CPC .............. *H03F 1/342* (2013.01); *H03F 3/16* (2013.01); *H03G 3/30* (2013.01); *H03F 2200/129* (2013.01); *H03F 2200/156* (2013.01); *H03F 2200/267* (2013.01); *H03F 2200/294* (2013.01); *H03F 2200/72* (2013.01); *H03F 2200/75* (2013.01)

(58) Field of Classification Search
CPC ....................................................... H03F 1/342
See application file for complete search history.

(56) References Cited

U.S. PATENT DOCUMENTS 7,486,135 B2   2/2009  Mu
9,479,126 B2  10/2016  Ilkov et al.
(Continued)

FOREIGN PATENT DOCUMENTS

JP     2008-28908 A    2/2008
JP     2009-207031 A   9/2009
(Continued)

OTHER PUBLICATIONS

Korean Office Action dated Jul. 2, 2019 in corresponding Korean Patent Application No. 10-2018-0051200 (5 pages in English, 5 pages in Korean).

*Primary Examiner* — Patricia T Nguyen
(74) *Attorney, Agent, or Firm* — NSIP Law

(57) ABSTRACT

An apparatus includes an amplifying circuit configured to include stacked first and second transistors, and to amplify a signal input from an input terminal during an operation in an amplifying mode, and provide the amplified signal to an output terminal, and a negative feedback circuit comprising first to nth sub-negative feedback circuits, each corresponding to a separate gain mode included in the amplifying mode, wherein the negative feedback circuit is configured to provide a variable resistance value to determine a negative feedback gain based on each of the separate gain modes.

22 Claims, 9 Drawing Sheets

(56) References Cited

U.S. PATENT DOCUMENTS

| | | | | |
|---|---|---|---|---|
| 2007/0024377 A1* | 2/2007 | Wang | ........................ | H03F 1/42 |
| | | | | 330/305 |
| 2009/0102552 A1* | 4/2009 | Shiramizu | ................ | H03F 1/342 |
| | | | | 330/98 |
| 2014/0340150 A1* | 11/2014 | Dempsey | ................ | H03F 1/223 |
| | | | | 330/260 |
| 2015/0091650 A1* | 4/2015 | Nobbe | .................... | H03F 1/223 |
| | | | | 330/291 |
| 2015/0188500 A1* | 7/2015 | Kang | .................... | H03F 1/3247 |
| | | | | 330/260 |
| 2017/0133989 A1* | 5/2017 | Dykstra | ................ | H03F 1/3205 |
| 2019/0007003 A1* | 1/2019 | Sivonen | .............. | H03F 3/45941 |

FOREIGN PATENT DOCUMENTS

| KR | 10-2004-0025392 A | 3/2004 |
|---|---|---|
| KR | 10-2010-0067934 A | 6/2010 |
| KR | 10-1351248 B1 | 1/2014 |

* cited by examiner

VARIABLE GAIN LOW NOISE AMPLIFIER WITH PHASE COMPENSATION

CROSS-REFERENCE TO RELATED APPLICATION

This application claims the benefit under 35 USC § 119(a) of priority to Korean Patent Application No. 10-2018-0051200 filed on May 3, 2018 in the Korean Intellectual Property Office, the disclosure of which is incorporated herein by reference for all purposes.

BACKGROUND

1. Field

This application relates to a variable gain low noise amplifier with phase compensation.

2. Description of Related Art

Recently, there has been demand for amplifiers (e.g., a power amplifier or a low noise amplifier) which process high volumes of transmitted and received data and have a higher output power and efficiency, along with high sensitivity, in wireless communication systems.

Particularly, low noise amplifiers (LNAs) have been developed that have various gains to satisfy a significant increase in performance in signals of a certain level while receiving signals ranging from very low signals to high signals. Generally, low noise amplifiers may have a gain of −10 dB at 20 dB, and a performance indicator of low noise amplifiers may change, depending on a gain.

For example, a typical low noise amplifier structure may have a bypass mode and a low noise amplifier mode, and another typical low noise amplifier structure may change a gain of the low noise amplifier by providing a plurality of cores for the low noise amplifier.

However, in the examples of the typical low noise amplifier structures, to implement a variable gain, a gain mode may be limited, and if multiple cores are implemented, the low noise amplifier may have a bulky for factor when connected in parallel. Accordingly, there may be a problem in terms of miniaturization.

Further, typically, it may be difficult to compensate a phase that changes according to a variable gain, and accordingly, the performance of the low noise amplifier may degrade due to a phase change caused by variations.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an apparatus includes an amplifying circuit configured to include stacked first and second transistors, and to amplify a signal input from an input terminal during an operation in an amplifying mode, and provide the amplified signal to an output terminal, and a negative feedback circuit comprising first to nth sub-negative feedback circuits, each corresponding to a separate gain mode included in the amplifying mode, wherein the negative feedback circuit is configured to provide a variable resistance value to determine a negative feedback gain based on each of the separate gain modes.

The negative feedback circuit may be connected between an intermediate connection node between the first and second transistors and an input node connected to the input terminal.

The amplifying circuit may further include a common source amplifying circuit including a common source transistor configured to amplify the signal input from the input terminal, and a common gate amplifying circuit including first and second common gate transistors connected by a cascode connection to the common source transistor, and configured to further amplify the signal amplified by the common source amplifying circuit, wherein the second transistor may be the second common gate transistor, and the first transistor may be one of the first common gate transistor and the common source transistor.

The first to nth negative feedback circuits may be connected in parallel between the intermediate connection node and the input terminal.

The first sub-negative feedback circuit may include a first switch and a second switch connected in series between the intermediate connection node and the input terminal, a first resistor and a second resistor connected in series between the first switch and the second switch, and a phase compensation capacitor connected between a connection node between the first resistor and the second resistor and a ground.

The nth sub-negative feedback circuit may include a first switch and a second switch connected in series between the intermediate connection node and the input terminal, a first resistor and a second resistor connected in series between the first switch and the second switch, and a phase compensation capacitor connected between a connection node between the first resistor and the second resistor and a ground.

The first to nth sub-negative feedback circuits may include different resistance values.

At least one of the first to nth sub-negative feedback circuits may be switched on.

In a general aspect, an apparatus includes an amplifying circuit configured to include stacked first and second transistors, and to amplify a signal input from an input terminal during an operation in an amplifying mode, and provide the amplified signal to an output terminal, a bypass circuit configured to transmit the signal input from the input terminal to the output terminal during an operation in a bypass mode, an output load circuit configured to adjust a gain of the amplifying circuit, and a negative feedback circuit configured to provide a variable resistance value to determine a negative feedback gain based on each of a plurality of separate gain modes included in the amplifying mode.

The output load circuit may be connected to an output node between the outload load circuit and the output terminal.

The negative feedback circuit may be connected between an intermediate connection node between the first and second transistors and an input node connected to the input terminal.

The amplifying circuit may further include a common source amplifying circuit comprising a common source transistor configured to amplify the signal input from the input terminal, and a common gate amplifying circuit comprising first and second common gate transistors connected by a cascode connection to the common source transistor, and configured to further amplify the signal amplified by the common source amplifying circuit, wherein the second transistor may be the second common gate transistor, and the first transistor may be one of the first common gate transistor and the common source transistor.

The negative feedback circuit may include first to nth sub-negative feedback circuits connected in parallel between the intermediate connection node and the input terminal.

The first sub-negative feedback circuit may include a first switch and a second switch connected in series between the intermediate connection node and the input terminal, a first resistor and a second resistor connected in series between the first switch and the second switches, and a phase compensation capacitor connected between a connection node between the first resistor and the second resistor and a ground.

The nth sub-negative feedback circuit may include a first switch and a second switch connected in series between the intermediate connection node and the input terminal, a first resistor and a second resistor connected in series between the first switch and the second switch, and a phase compensation capacitor connected between a connection node between the first resistor and the second resistor and a ground.

The first to nth sub-negative feedback circuits may include different resistance values.

At least one of the first to nth negative feedback circuits may be switched on.

In a general aspect, a method includes amplifying a signal received from an input terminal during an operation in an amplifying mode, operating the amplifying mode in one or more gain modes, and determining different negative feedback gains corresponding to each of the plurality of gain modes included in the amplifying mode based on changes in a resistance value of a negative feedback circuit.

The method may further include bypassing the signal received from the input terminal to an output terminal during an operation in a bypass mode.

Other features and aspects will be apparent from the following detailed description, the drawings, and the claims.

BRIEF DESCRIPTION OF THE DRAWINGS

FIG. 9A illustrates a phase change according to a gain change in an example in which a phase compensation is not applied, while FIG. 9B illustrates a phase change according to a gain change in an example in which a gain compensation is applied.

Figure 1:
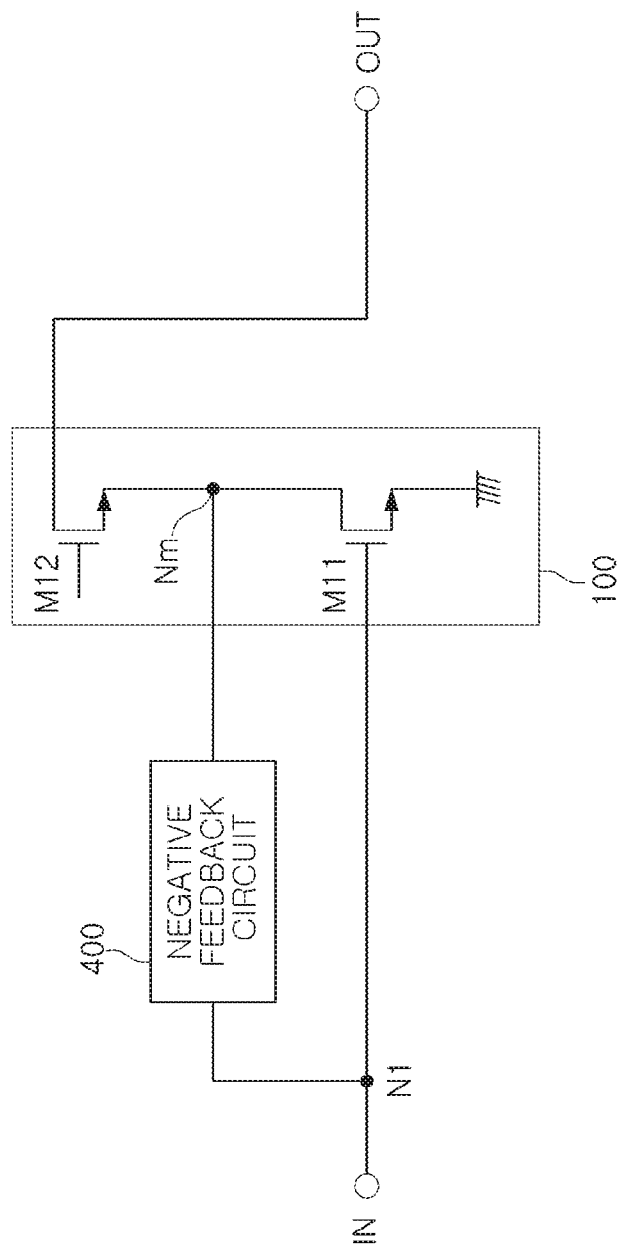
FIG. 1 is a view illustrating an example of a variable gain low noise amplifier.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

With regard to the drawings, unnecessarily overlapped descriptions of elements denoted by the same reference numerals and having the same functions will be omitted, and differences among the drawings will be described.

In drawings, the same reference numerals will be used to denote elements having substantially the same configurations and functions, in accordance with the overall description of the present disclosure.

FIG. 1 is a view illustrating an example of a variable gain low noise amplifier. Referring to FIG. 1, the variable gain low noise amplifier may include an amplifying circuit 100 and a negative feedback circuit 400.

The amplifying circuit 100 may include stacked first and second transistors M11 and M12, and may amplify a signal input via an input terminal IN in an amplifying mode and provide the amplified signal via an output terminal OUT. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The negative feedback circuit 400 may be connected between an intermediate connection node Nm between the first and second transistors M11 and M12 and an input node N1 connected to the input terminal IN, and may include a variable resistance value to determine a negative feedback gain based on each of a plurality of gain modes included in the amplifying mode.

Figure 2:
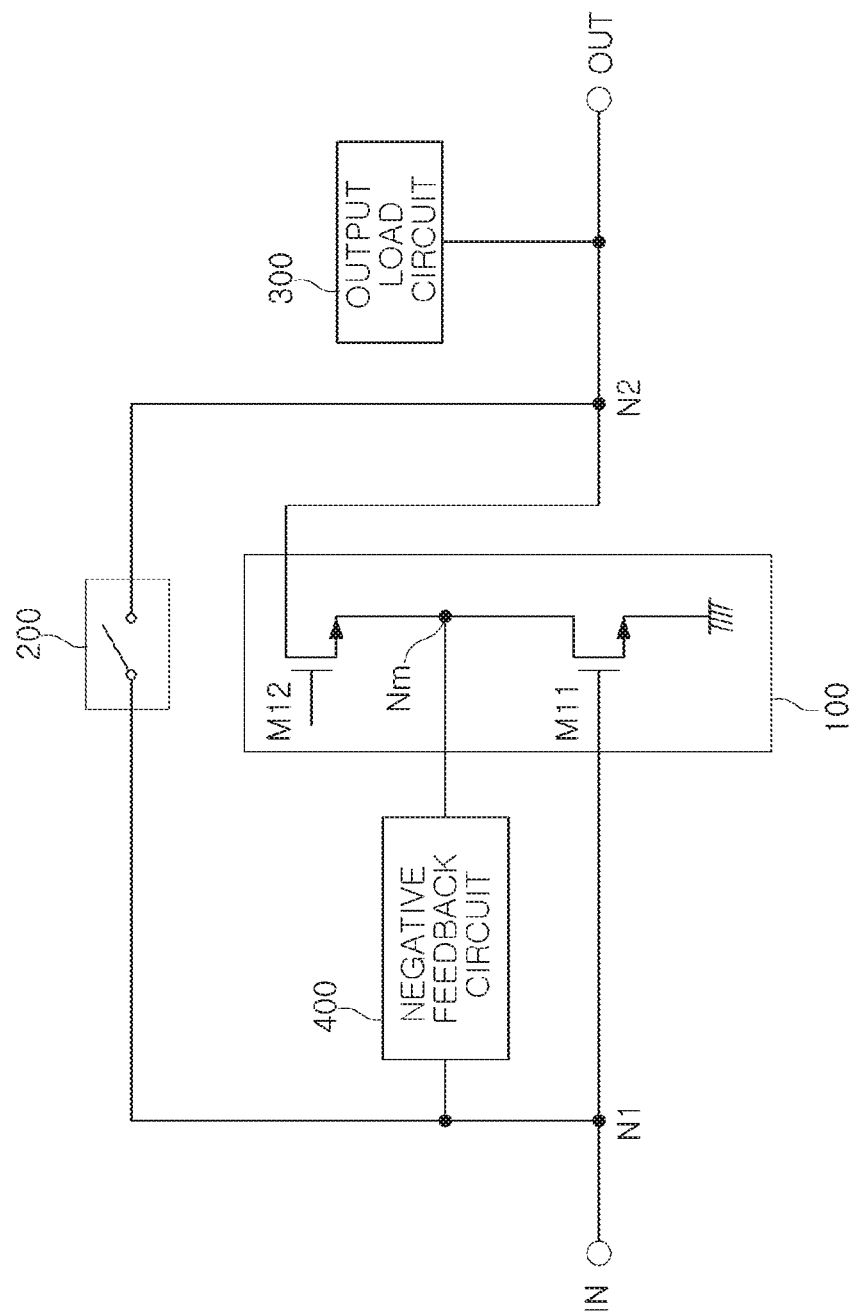
FIG. 2 is a view illustrating an example of a variable gain low noise amplifier.

FIG. 2 is a view illustrating an example of a variable gain low noise amplifier. Referring to FIG. 2, the variable gain low noise amplifier according to an example may include the amplifying circuit 100, a bypass circuit 200, an output load circuit 300 and the negative feedback circuit 400.

The amplifying circuit 100 may include the stacked first and second transistors M11 and M12, and may amplify a signal input via the input node N1 connected to the input terminal IN in an amplifying mode, and provide the amplified signal via the output terminal OUT.

The bypass circuit 200 may allow the signal input via the input terminal IN to be bypassed to an output node N2 connected to the output terminal OUT in a bypass mode.

The output load circuit 300 may be connected to an output node N2 connected to the output terminal OUT, and adjust a gain of the amplifying circuit 100.

The negative feedback circuit 400 may be connected between the intermediate connection node Nm between the first and second transistors M11 and M12 and the input node N1, and include a variable resistance value to determine a negative feedback gain based on each of a plurality of gain modes included in the amplifying mode.

Figure 3:
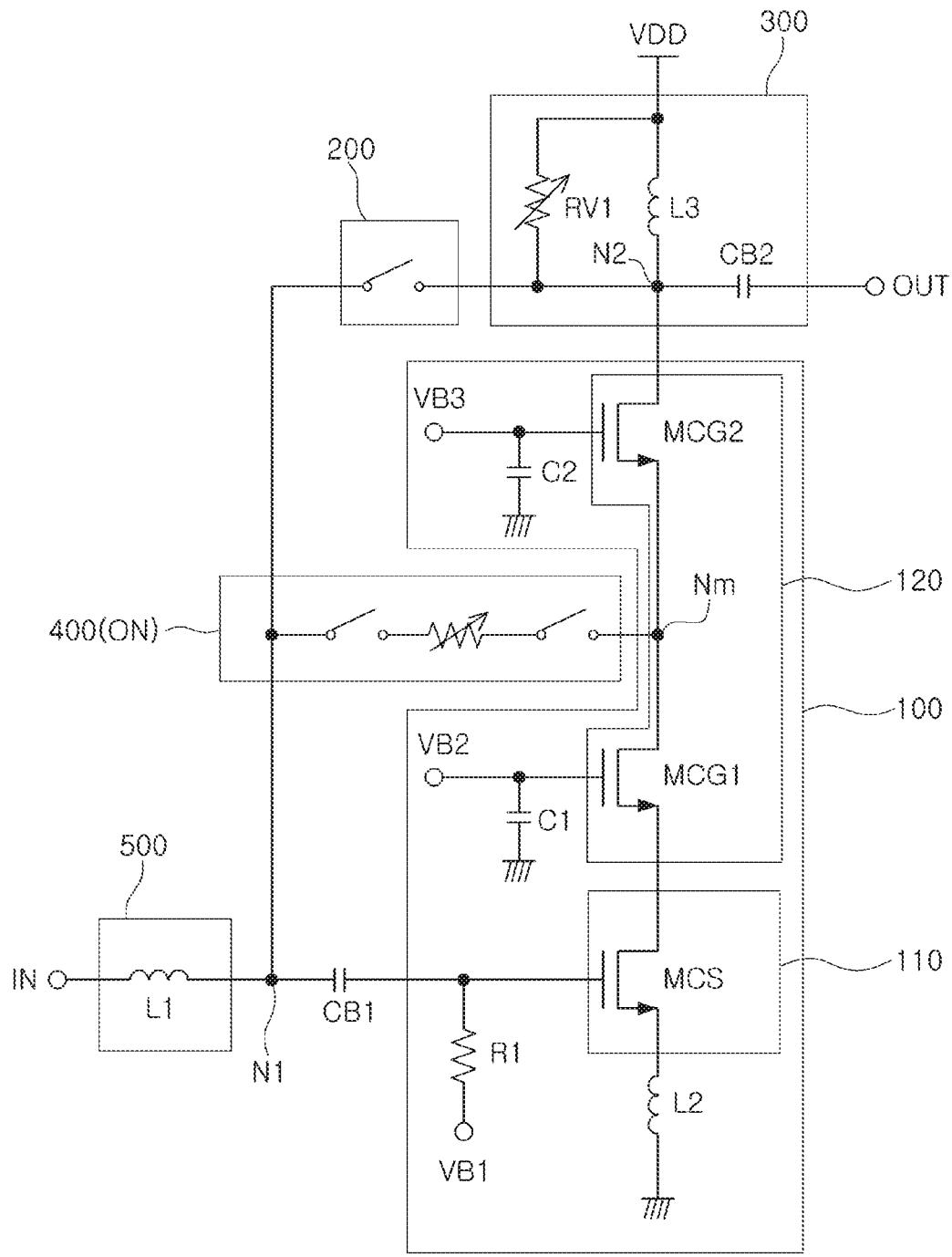
FIG. 3 is a circuit diagram illustrating an example of a variable gain low noise amplifier.

FIG. 3 illustrates an example of a circuit diagram of a variable gain low noise amplifier.

Referring to FIG. 3, the variable gain low noise amplifier may further include an input matching circuit 500 connected between the input terminal IN and the input node N1. For example, the input matching circuit 500 may include a coil L1.

The amplifying circuit 100 may include a common source amplifying circuit 110 and a common gate amplifying circuit 120.

The common source amplifying circuit 110 may include a common source transistor MCS amplifying a signal input via the input terminal IN. For example, a gate of the common source transistor MCS may be connected to a first bias voltage VB1 terminal connected through a resistor R1, and a coil L2 may be connected between a source of the common source transistor MCS and a ground. Also, a direct current blocking capacitor CB1 may be connected between the input node N1 and a node to which the first bias voltage VB1 terminal is connected.

The common gate amplifying circuit 120 may include the first and second common gate transistors MCG1 and MCG2 connected to the common source transistor MCS by cascode connection to further amplify the signal amplified by the common source amplifying circuit 110. For example, a gate of the first common gate transistor MCG1 may be connected to a second bias voltage VB2 terminal, and a capacitor C1 may be connected between the gate of the first common gate transistor MCG1 and a ground. A source of the first common gate transistor MCG1 may be connected to a drain of the common source transistor MCS, and a drain of the first common gate transistor MCG1 may be connected to a source of the second common gate transistor MCG2. Also, a gate of the second common gate transistor MCG2 may be connected to a third bias voltage VB3 terminal, and a capacitor C2 may be connected between a gate of the second common gate transistor MCG2 and a ground. A source of the second common gate transistor MCG2 may be connected to a drain of the first common gate transistor MCG1 through a node Nm, and a drain of the second common gate transistor MCG2 may be connected to the output node N2.

According to examples, the second transistor M12 illustrated in FIGS. 1 and 2 may be the second common gate transistor MCG2, and the first transistor M11 illustrated in FIGS. 1 and 2 may be one of the first common gate transistor MCG1 and the common source transistor MCS.

For example, according to examples, the intermediate connection node Nm may be a connection node of the first and second common gate transistors MCG1 and MCG2, and the first and second common gate transistors MCG1 and MCG2 may correspond to the respective first and second transistors M11 and M12 in FIGS. 1 and 2. As another example, the intermediate connection node Nm may be a connection node between the common source transistor MCS and the first common gate transistor MCG1, and the common source transistor MCS and the first common gate transistor MCG1 may correspond to the respective first and second transistors M11 and M12 in FIGS. 1 and 2.

The negative feedback circuit 400 may be connected between the input node N1 and the intermediate connection node Nm, and may change a resistance value to determine different negative feedback gains based on the plurality of gain modes. The operation of the negative feedback circuit 400 will be described with reference to FIG. 4.

Figure 4:
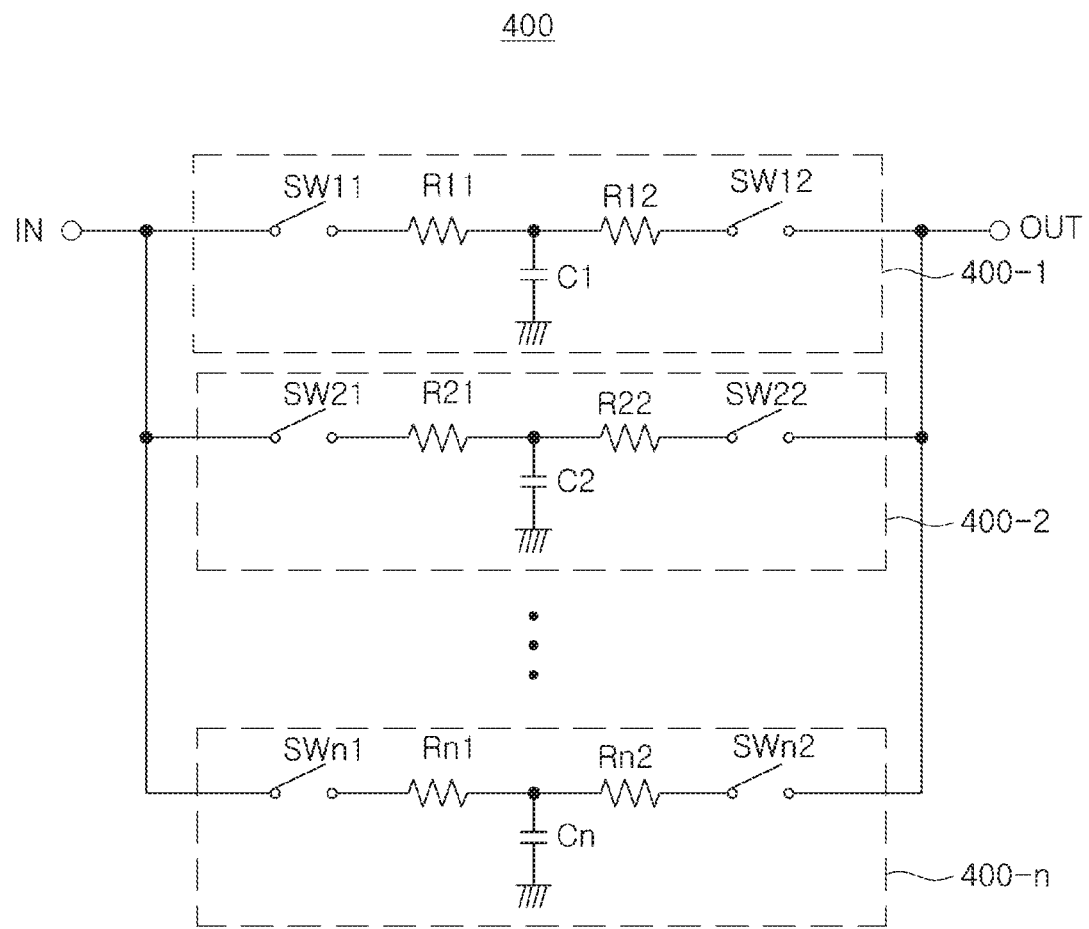
FIG. 4 is a view illustrating an example of a negative feedback circuit.

FIG. 4 is a view illustrating an example of a negative feedback circuit.

Referring to FIG. 4, the example negative feedback circuit 400 may include 1st to nth sub-negative feedback circuits 400-1, . . . 400-n (where "n" is a natural number equal to or higher than 2) connected in parallel between the intermediate connection node Nm (FIG. 3) and the input terminal IN.

For example, the negative feedback circuit 400 may include sub-negative feedback circuits corresponding to the number of a plurality of gain modes. For example, in an example in which the amplifying mode 100 (FIG. 3) is operated with two gain modes, the negative feedback circuit 400 may include first and second sub-negative feedback circuits 400-1 and 400-2. As another example, in an example in which the amplifying circuit 100 (FIG. 3) is operated with the n number of gain modes, the negative feedback circuit 400 may include 1st to nth sub-negative feedback circuits 400-1, . . . 400-n.

When one of the 1st to nth sub-negative feedback circuits 400-1, . . . 400-n is in an on state, a resistance value may be provided to determine a corresponding negative feedback gain.

The first sub-negative feedback circuit 400-1 may include first and second switches SW11 and SW12 connected in series between the intermediate connection node Nm and the input terminal IN, first and second resistors R11 and R12 connected in series between the first and second switches SW11 and SW12, and a capacitor C1 for phase compensation connected between a connection node between the first and second resistors R11 and R12 and a ground.

The second sub-negative feedback circuit 400-2 may include first and second switches SW21 and SW22 connected in series between the intermediate connection node Nm and the input terminal IN, first and second resistors R21 and R22 connected in series between the first and second switches SW21 and SW22, and a capacitor C2 for phase compensation connected between a connection node between the first and second resistors R21 and R22 and a ground.

The nth sub-negative feedback circuit 400-n may include first and second switches SWn1, SWn2 connected in series between the intermediate connection node Nm and the input terminal IN, first and second resistors Rn1 and Rn2 connected in series between the first and second switches SWn1 and SWn2, and a capacitor Cn for phase compensation connected between a connection node between the first and second resistors Rn1 and Rn2 and a ground.

The 1st to nth sub-negative feedback circuits 400-1, 400-2, . . . 400-n may include different resistance values to correspond to the plurality of gain modes, and the plurality of capacitors for phase compensation C1, C2, . . . Cn may be set to have different capacitor values to correspond to the plurality of gain modes. Accordingly, different phase distortions generated in each of the plurality of gain modes may be appropriately compensated. The phase compensation operation will be described with reference to FIGS. 9A and 9B.

The 1st to nth sub-negative feedback circuits 400-1, 400-2, . . . 400-n may be configured as illustrated in FIG. 4, but are not limited thereto. The 1st to nth sub-negative feedback circuits 400-1, 400-2, . . . 400-n may include at least one switch, one resistor and one capacitor.

As an example, a plurality of gain modes included in the amplifying mode may include a first gain mode, a second gain mode, third and fourth gain modes, which operate by different gains. The variable gain low noise amplifier may operate in one of five gain modes including the first to fourth gain modes and the bypass mode. The gain mode operations will be described with reference to FIGS. 5 to 7.

Figure 5:
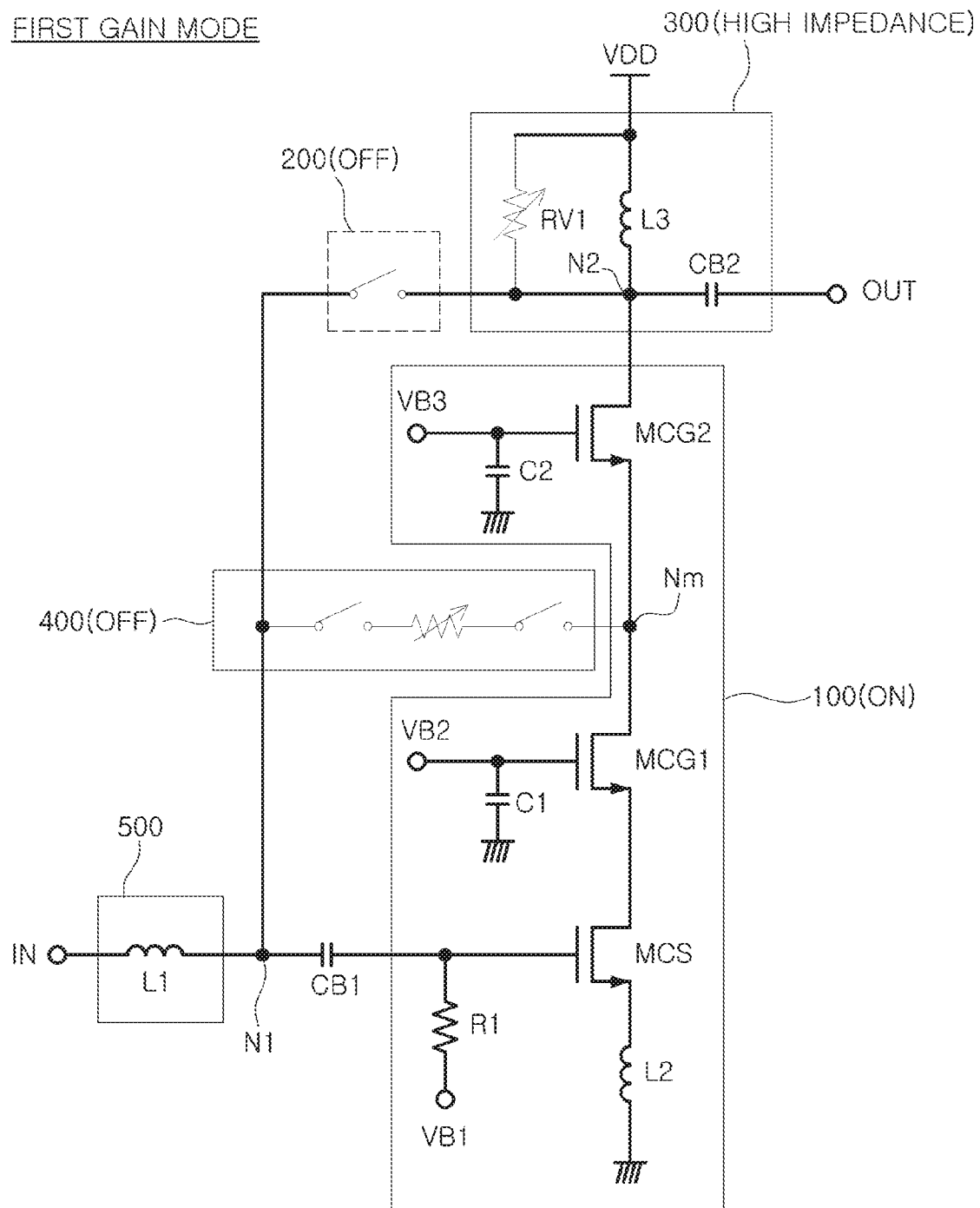
FIG. 5 is a schematic view illustrating an example of operations of a variable gain low noise amplifier in a first gain mode.

FIG. 5 is a schematic view illustrating example operations of a variable gain low noise amplifier in a first gain mode.

Referring to FIG. 5, when the variable gain low noise amplifier, for example, the variable gain low noise amplifier illustrated in FIG. 3, is in a first high gain mode, which is the first gain mode, the bypass circuit 200 and the negative feedback circuit 400 may be in an off state.

For example, in an example in which a variable resistance RV1 of the output load circuit 300 is a switched variable resistance circuit, when all switches therein are switched off, and an impedance becomes high (ideally, an infinite impedance), there may be no impact on an impedance of the inductor L3.

Figure 6:
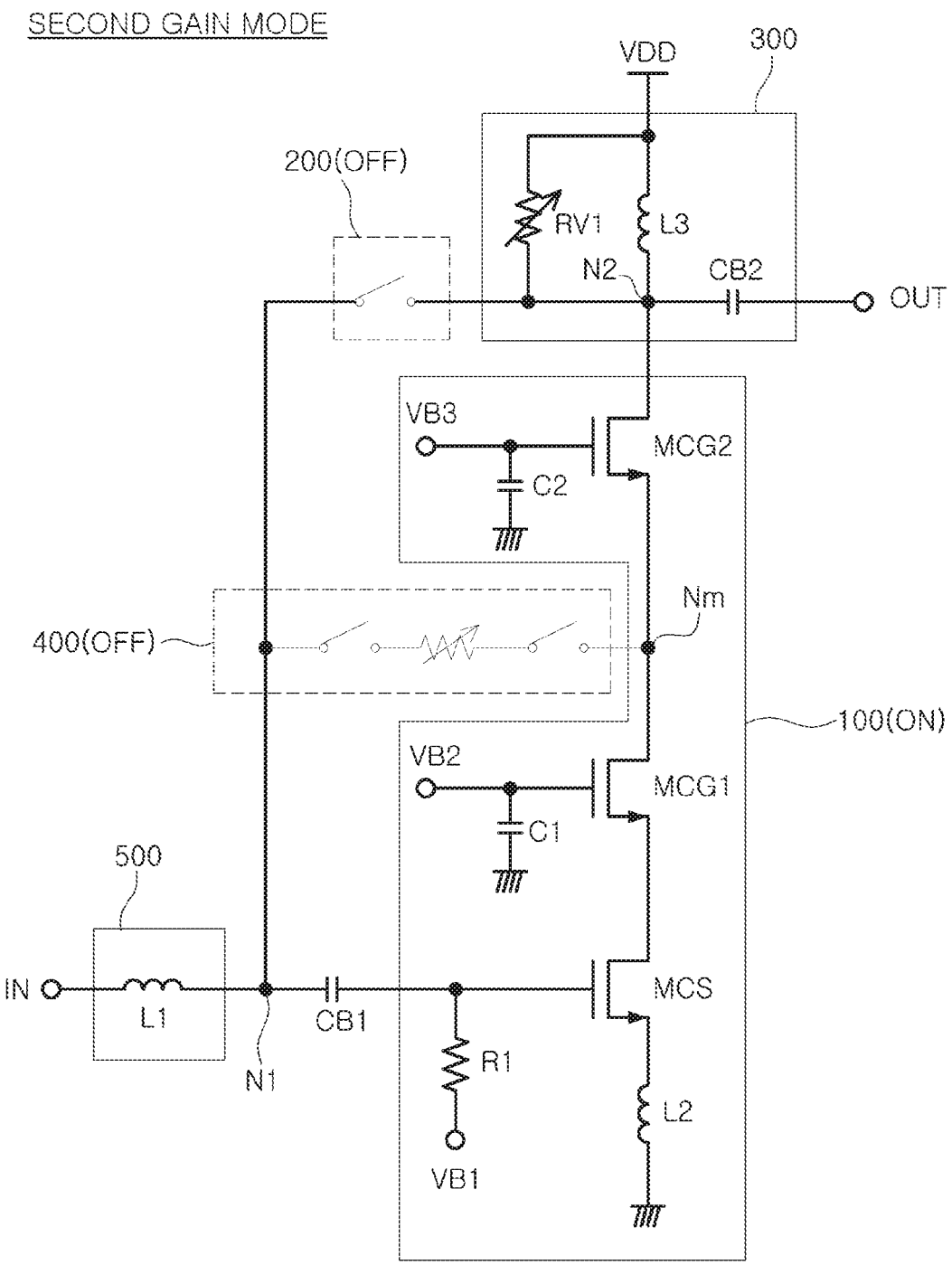
FIG. 6 is a schematic view illustrating an example of operations of a variable gain low noise amplifier in a second gain mode.

FIG. 6 is a schematic view illustrating example operations of a variable gain low noise amplifier in a second gain mode.

Referring to FIG. 6, when the variable gain low noise amplifier, for example, the variable gain low noise amplifier illustrated in FIG. 3, is in a high gain mode, which is the second gain mode, gain may be controlled by tuning a variable resistance of the output load circuit 300, and the bypass circuit 200 and the negative feedback circuit 400 may be in an off state.

As described above, in the high gain mode, which may be the first and second gain modes, a noise figure may become a more important factor than linearity. Thus, in the first and second gain modes, by setting an impedance of the negative feedback circuit and an impedance of the bypass circuit to be higher than an impedance of the low noise amplifier LNA, a noise figure NF of the low noise amplifier may improve and isolation of the entire circuit may be secured, thereby performing operations stably.

Figure 7:
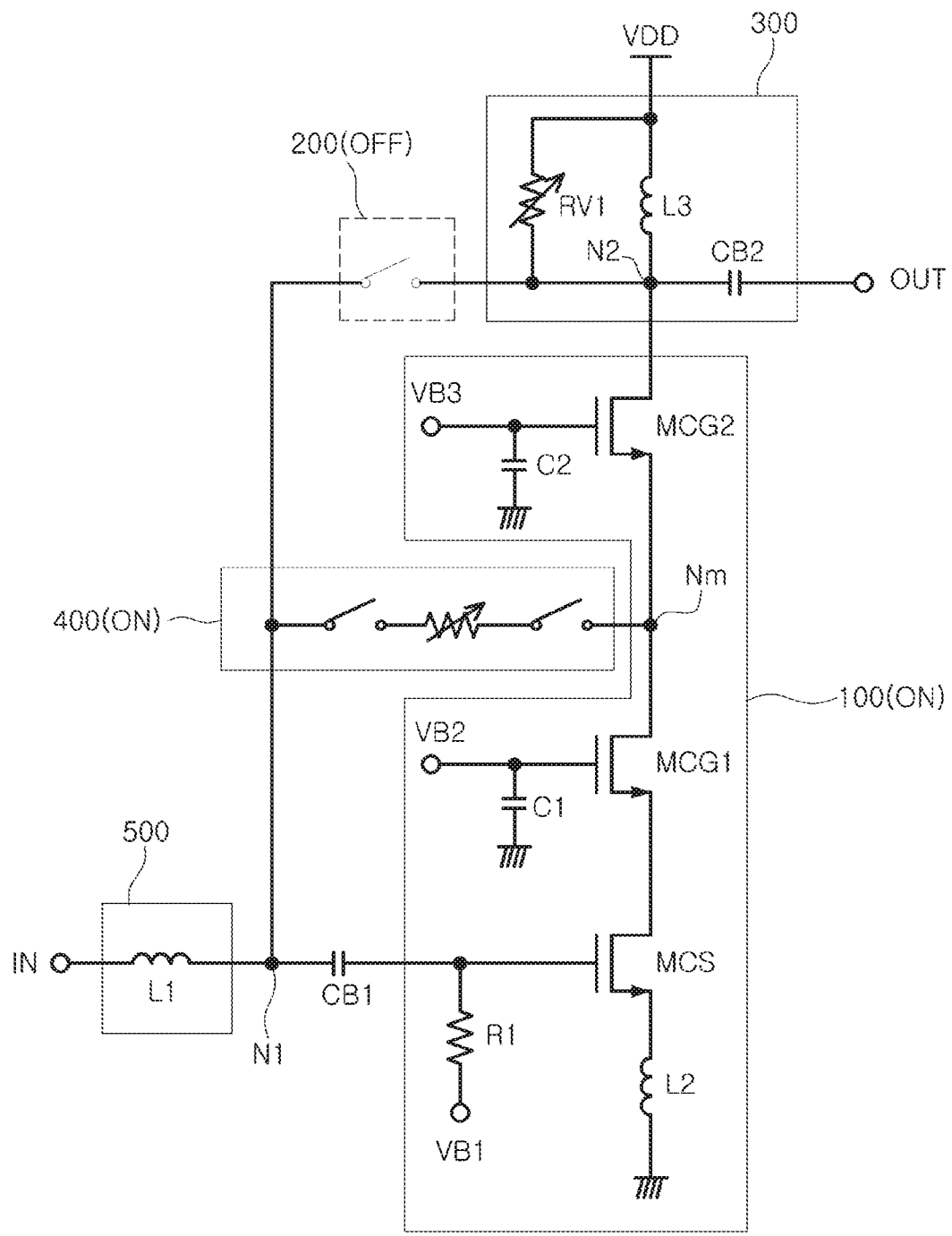
FIG. 7 is a schematic view illustrating an example of operations of a variable gain low noise amplifier in third and fourth gain modes.

FIG. 7 is a schematic view illustrating example operations of a variable gain low noise amplifier in third and fourth gain modes.

Referring to FIG. 7, when the variable gain low noise amplifier, for example, the variable gain low noise amplifier illustrated in FIG. 3, is in low gain modes, which may be the third and fourth gain modes, the bypass circuit 200 may enter an off state, and the negative feedback circuit 400 may operate.

For example, in the third gain mode, the first sub-negative feedback circuit 400-1 may operate and provide the first resistance value (R11+R12 in FIG. 4) and the first capacitor value (C1 in FIG. 4). Also, in the fourth gain mode, in the example in which n is two in the nth sub-negative feedback circuit 400-n of the negative feedback circuit 400, the second sub-negative feedback circuit 400-2 may operate and provide the second resistance value (R21+R22 in FIG. 4) and the second capacitor value (C2 in FIG. 4).

As described above, as the first sub-negative feedback circuit 400-1 and the second sub-negative feedback circuit 400-2 of the negative feedback circuit 400 operate in each of the first and second low gain modes, the third and fourth gain modes, and a lower gain and a higher linearity may be secured in the variable gain low noise amplifier.

The operations discussed above may include a method for controlling the variable gain. A signal that is received from the input terminal IN may be amplified during an operation in an amplifying mode. The amplifying mode may be implemented in one or more gain modes. Different individual negative feedback gains corresponding to each of the plurality of gain modes included in the amplifying mode may be obtained based on changes in a resistance value of a negative feedback circuit.

Figure 8:
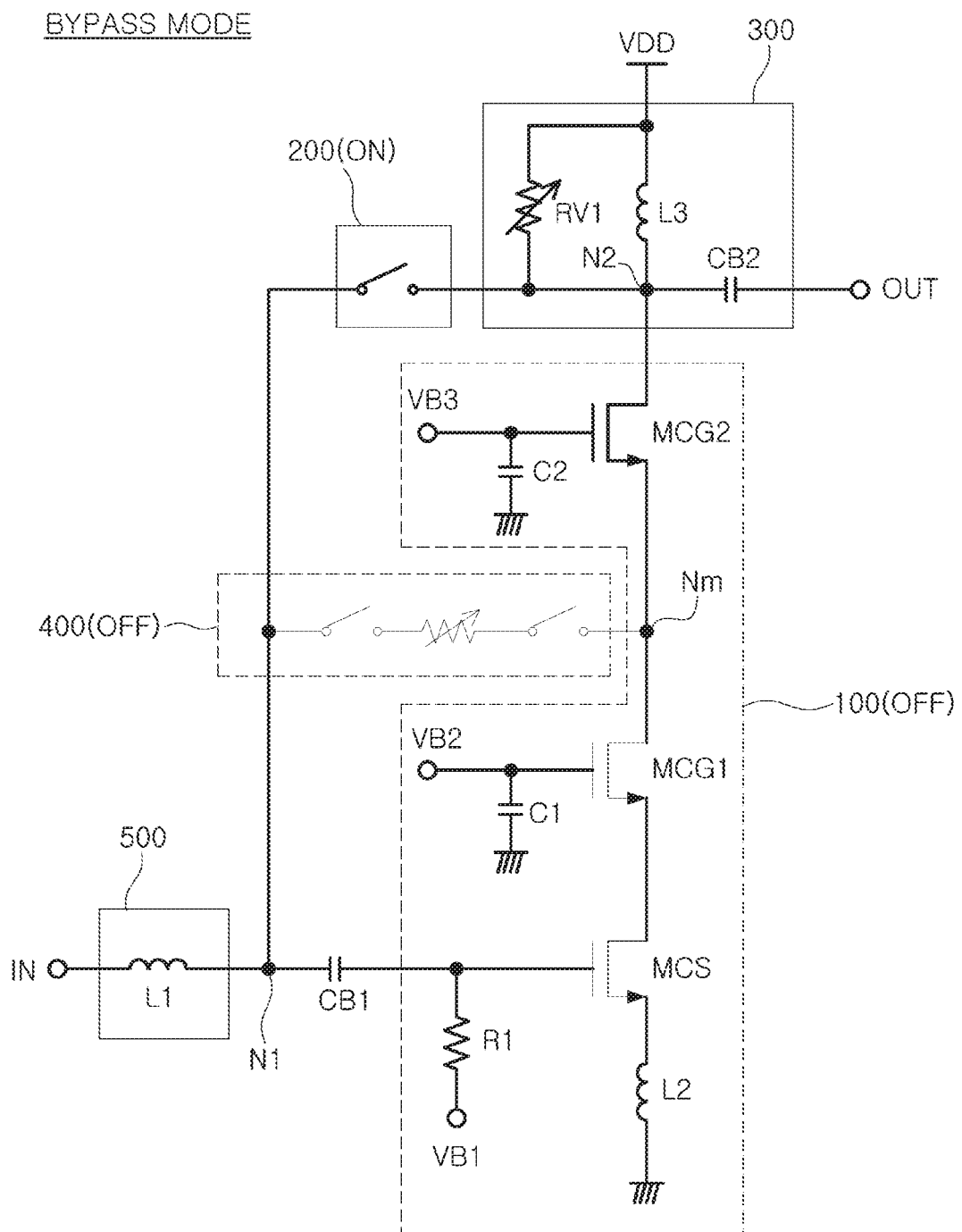
FIG. 8 is a schematic view illustrating an example of operations of a variable gain low noise amplifier in a bypass mode.

FIG. 8 is a schematic view illustrating operations of a variable gain low noise amplifier in a bypass mode.

Referring to FIG. 8, when the variable gain low noise amplifier, for example, the variable gain low noise amplifier illustrated in FIG. 3, is in the bypass mode, the bypass circuit 200 may enter an on state, and the negative feedback circuit 400 and the amplifying circuit 100 may not operate. That is, the negative feedback circuit 400 and the amplifying circuit 100 may each be in an off state.

In this example, a signal input via the input terminal IN may be transferred to the output terminal OUT via the bypass circuit 200 without being amplified.

Also, since, the negative feedback circuit 400 is not connected to a signal line in which an input signal flows, but is connected between the intermediate connection node Nm between the two transistors M11 and M12, and the input node N1, a feedback to the input node N1 in the intermediate connection node Nm may be performed, and degradation of isolation in a low gain mode may be prevented as well.

Figure 9A:
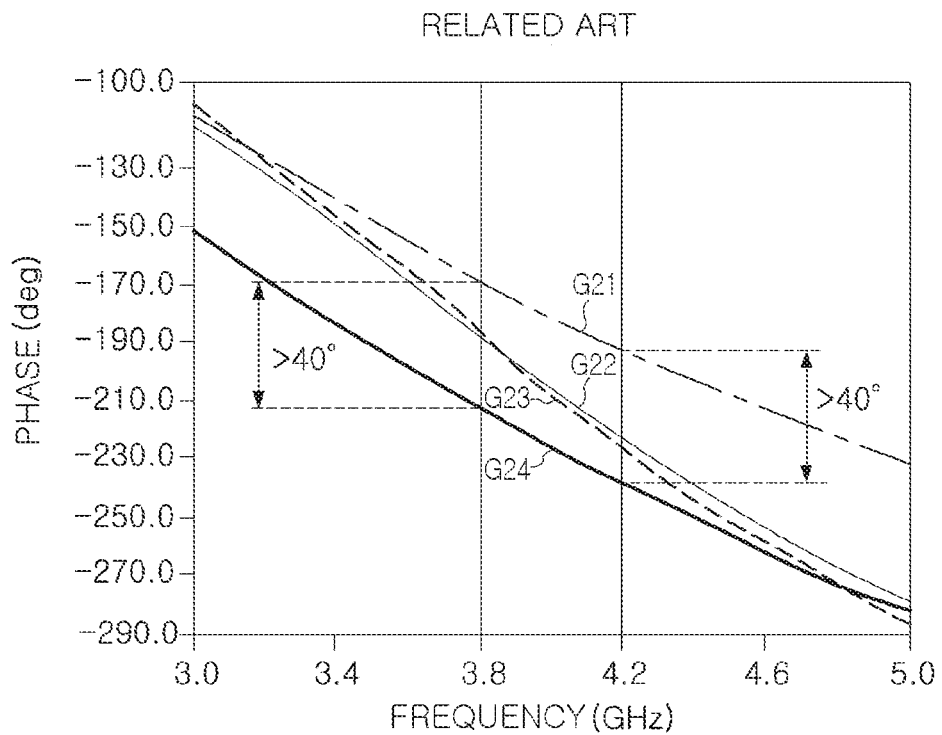
FIGS. 9A and 9B are graphs illustrating examples of a phase change in relation to a gain change.
Figure 9B:
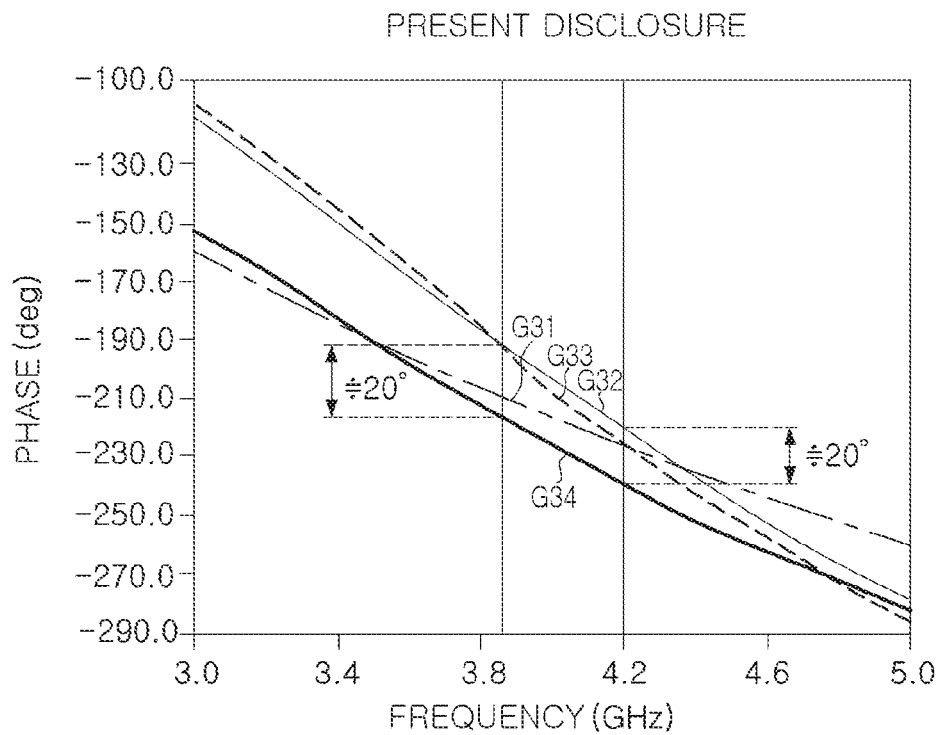

FIGS. 9A and 9B are graphs illustrating examples of a phase change in relation to a gain change. FIG. 9A shows a phase change according to a gain change in the example in which a phase compensation is not applied, and 9B shows a phase change according to a gain change in the case in which a gain compensation is applied.

FIGS. 9A and 9B are graphs illustrating a phase change according to a gain change in a broadband of 3.3 GHz-4.2 GHz. Graphs G21, G22, G23 and G24 in FIG. 9A show a gain-phase relationship in different gain modes in an existing low noise amplifier, and graphs G31, G32, G33 and G34 in FIG. 9B also show a gain-phase relationship in different gain modes in the existing low noise amplifier.

According to graphs G21 and G24 in FIG. 9A, a phase difference is greater than 40 degrees approximately in the example in which a phase compensation is not applied.

However, according to graphs G32 and G34 in FIG. 9B, a phase difference reduced to 20 degrees or lower than in the case in which a phase difference is applied.

Accordingly, in the example in which the negative feedback circuit and the bypass circuit are used, there may be no degradation while isolation moves from a high gain mode to a low gain mode.

Also, by using various gains and significantly reducing a noise figure and a phase discontinuity, a circuit satisfying the specification required in a communication system may be provided, and a low noise amplifier having a very competitive topology may be secured accordingly.

According to an example, a phase that changes according to a gain variation may be compensated in a variable gain low noise amplifier, and a gain period may be extended to a period between a high gain mode and a bypass mode as well.

Accordingly, various gains and noise figures may be obtained, as well as significant reduction of phase discontinuity, and consequently, by providing a circuit satisfying the specification required in a system, a competitive variable gain low noise amplifier may be implemented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplifying apparatus comprising:
    an amplifying circuit configured to include stacked first and second transistors, and to amplify a signal input from an input terminal during an operation in an amplifying mode, and provide the amplified signal to an output terminal; and
    a negative feedback circuit comprising first to nth sub-negative feedback circuits, each corresponding to a separate gain mode included in the amplifying mode,
    wherein the negative feedback circuit is configured to provide a variable resistance value to determine a negative feedback gain based on each of the separate gain modes,
    wherein the negative feedback circuit is connected between the input terminal and the first and second transistors, and
    wherein the first sub-negative feedback circuit comprises a first switch and a second switch connected in series between an intermediate connection node and the input terminal, and a first resistor and a second resistor connected in series between the first switch and the second switch.

2. The apparatus of claim 1, wherein the negative feedback circuit is connected between the intermediate connection node and an input node connected to the input terminal, and
    wherein the intermediate connection node is between the first and second transistors.

3. The apparatus of claim 1, wherein the amplifying circuit further comprises:
    a common source amplifying circuit comprising a common source transistor configured to amplify the signal input from the input terminal; and
    a common gate amplifying circuit comprising first and second common gate transistors connected by a cascode connection to the common source transistor, and configured to further amplify the signal amplified by the common source amplifying circuit,
    wherein the second transistor is the second common gate transistor, and the first transistor is one of the first common gate transistor and the common source transistor.

4. The apparatus of claim 2, wherein the first to nth negative feedback circuits are connected in parallel between the intermediate connection node and the input terminal.

5. The apparatus of claim 4, wherein the first sub-negative feedback circuit further comprises:
    a phase compensation capacitor connected between a connection node between the first resistor and the second resistor and a ground.

6. The apparatus of claim 4, wherein the nth sub-negative feedback circuit comprises:
    a first switch and a second switch connected in series between the intermediate connection node and the input terminal;
    a first resistor and a second resistor connected in series between the first switch and the second switch, and
    a phase compensation capacitor connected between a connection node between the first resistor and the second resistor and a ground.

7. The apparatus of claim 4, wherein the first to nth sub-negative feedback circuits comprise different resistance values.

8. The apparatus of claim 4, wherein at least one of the first to nth sub-negative feedback circuits is switched on.

9. An apparatus comprising:
    an amplifying circuit configured to include stacked first and second transistors, and to amplify a signal input from an input terminal during an operation in an amplifying mode, and provide the amplified signal to an output terminal;

a bypass circuit configured to transmit the signal input from the input terminal to the output terminal during an operation in a bypass mode;

an output load circuit configured to adjust a gain of the amplifying circuit; and a negative feedback circuit configured to provide a variable resistance value to determine a negative feedback gain based on each of a plurality of separate gain modes included in the amplifying mode, wherein the negative feedback circuit is connected between the input terminal and the first and second transistors, and wherein the first sub-negative feedback circuit comprises a first switch and a second switch connected in series between an intermediate connection node and the input terminal, and a first resistor and a second resistor connected in series between the first switch and the second switches.

10. The apparatus of claim 9, wherein the output load circuit is connected to an output node between the outload load circuit and the output terminal.

11. The apparatus of claim 9, wherein the negative feedback circuit is connected between the intermediate connection node and an input node connected to the input terminal, and wherein the intermediate connection node is between the first and second transistors.

12. The apparatus of claim 9, wherein the amplifying circuit further comprises:

a common source amplifying circuit comprising a common source transistor configured to amplify the signal input from the input terminal, and a common gate amplifying circuit comprising first and second common gate transistors connected by a cascode connection to the common source transistor, and configured to further amplify the signal amplified by the common source amplifying circuit, wherein the second transistor is the second common gate transistor, and the first transistor is one of the first common gate transistor and the common source transistor.

13. The apparatus of claim 11, wherein the negative feedback circuit comprises first to nth sub-negative feedback circuits connected in parallel between the intermediate connection node and the input terminal.

14. The apparatus of claim 13, wherein the first sub-negative feedback circuit further comprises:

a phase compensation capacitor connected between a connection node between the first resistor and the second resistor and a ground.

15. The apparatus of claim 13, wherein the nth sub-negative feedback circuit comprises:

a first switch and a second switch connected in series between the intermediate connection node and the input terminal;

a first resistor and a second resistor connected in series between the first switch and the second switch; and a phase compensation capacitor connected between a connection node between the first resistor and the second resistor and a ground.

16. The apparatus of claim 13, wherein the first to nth sub-negative feedback circuits comprise different resistance values.

17. The apparatus of claim 13, wherein at least one of the first to nth negative feedback circuits is switched on.

18. A variable gain control method comprising:

amplifying a signal received from an input terminal during an operation in an amplifying mode;

operating the amplifying mode in one or more gain modes; and determining different negative feedback gains corresponding to each of the plurality of gain modes included in the amplifying mode based on changes in a resistance value of a negative feedback circuit, wherein the negative feedback circuit is connected between the input terminal and first and second transistors, and wherein a first sub-negative feedback circuit of the negative feedback circuit comprises a first switch and a second switch connected in series between an intermediate connection node and the input terminal, and a first resistor and a second resistor connected in series between the first switch and the second switch.

19. The method of claim 18, further comprising bypassing the signal received from the input terminal to an output terminal during an operation in a bypass mode.

20. The apparatus of claim 1, wherein the negative feedback circuit is configured to have different capacitor values for each of the plurality of gain modes to compensate for a change in phase generated in each of the plurality of gain modes.

21. The apparatus of claim 9, wherein the negative feedback circuit is configured to have different capacitor values for each of the plurality of gain modes to compensate for a change in phase generated in each of the plurality of gain modes.

22. The method of claim 18, further comprising determining different capacitor values for the negative feedback circuit for each of the plurality of gain modes to compensate for a change in phase generated in each of the plurality of gain modes.

* * * * *